(12) United States Patent
Kim

(10) Patent No.: US 7,227,403 B2
(45) Date of Patent: Jun. 5, 2007

(54) INTERNAL VOLTAGE GENERATOR FOR SEMICONDUCTOR DEVICE

(75) Inventor: Kwan Weon Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 137 days.

(21) Appl. No.: 11/108,493

(22) Filed: Apr. 18, 2005

(65) Prior Publication Data

US 2006/0104138 A1   May 18, 2006

(30) Foreign Application Priority Data

Nov. 15, 2004   (KR) .................. 10-2004-0093120

(51) Int. Cl.
*G05F 1/00* (2006.01)
(52) U.S. Cl. .................. 327/536; 327/537; 327/87
(58) Field of Classification Search .................. 327/87, 327/536, 537
See application file for complete search history.

(56) References Cited

U.S. PATENT DOCUMENTS 6,198,341 B1 * 3/2001 Ryu .................. 327/536
6,225,854 B1 * 5/2001 Cha .................. 327/536
6,765,428 B2 * 7/2004 Kim et al. .................. 327/536
2002/0084833 A1 * 7/2002 Kim et al. .................. 327/536

FOREIGN PATENT DOCUMENTS

KR   20020034218   5/2002

* cited by examiner

*Primary Examiner*—Long Nguyen
(74) *Attorney, Agent, or Firm*—Ladas & Parry LLP

(57) ABSTRACT

Disclosed is an internal voltage generator, which includes a detecting means for detecting a level of an internal voltage, an oscillator for generating a driving pulse signal in response to an output signal of the detecting means, a first driving unit for outputting a first pulse signal after receiving the driving pulse signal, a second driving unit for outputting a second pulse signal after receiving the driving pulse signal, and a pumping unit for changing a potential level of the internal voltage after selectively receiving one of the first pulse signal and the second pulse signal.

8 Claims, 2 Drawing Sheets

INTERNAL VOLTAGE GENERATOR FOR SEMICONDUCTOR DEVICE

BACKGROUND OF THE INVENTION

1. Field of the Invention

The present invention relates to an internal voltage generator, and more particularly to an internal voltage generator capable of outputting a back-bias voltage used as a substrate bias voltage of a semiconductor device.

2. Description of the Prior Art

Generally, an internal voltage generator is a circuit for generating an internal voltage used in a semiconductor device. The internal voltage generator includes a high voltage generator for generating an internal voltage larger than a supply voltage, a back-bias voltage generator for generating an internal voltage smaller than a ground voltage, a reference voltage generator for generating a predetermined reference voltage, etc.

For example, in a case of a memory device, which is a kind of semiconductor device, a high voltage generator is used for activating a word line. Further, a back-bias voltage generated by a back-bias voltage generator is applied to an N-well including a PMOS transistor, thereby adjusting the threshold voltage of the PMOS transistor.

FIG. 1 is a block diagram of a general internal voltage generator (in particular, a back-bias voltage generator).

As shown in FIG. 1, the back-bias voltage generator for generating a back-bias voltage VBB (internal voltage) includes a detection circuit 101 for detecting a back-bias voltage, a driving circuit 102 for outputting a predetermined pulse signal in response to the output signal of the detection circuit 101, and a pumping circuit 103 for lowering the back-bias voltage by a pumping operation when the pulse signal is applied from the driving circuit 102.

In the operation of the back-bias voltage generator, the pumping circuit 103 continues to perform the pumping operation until the back-bias voltage outputted from the pumping circuit 103 reaches a target level. Accordingly, after the back-bias voltage has reached the target level, the pumping circuit 103 stops the pumping operation and maintains the back-bias voltage at that time.

However, in the prior art, when a supply voltage VDD operating the driving circuit 102 of the back-bias voltage generator is unstable, the pulse signal applied to the pumping circuit 103 is also unstable. Therefore, it is difficult to generate a stable back-bias voltage.

In particular, since the supply voltage VDD of a semiconductor device has been recently lowered, the instability of the supply voltage may immediately cause the instability of an internal voltage.

SUMMARY OF THE INVENTION

Accordingly, the present invention has been made to solve the above-mentioned problems occurring in the prior art, and an object of the present invention is to provide an internal voltage generator capable of performing a stable pumping operation by selectively using a first pulse driving unit using a supply voltage and a second pulse driving unit using a stable internal voltage.

In order to achieve the above objects, according to one aspect of the present invention, there is provided an internal voltage generator for a semiconductor device, the internal voltage generator comprising: a detecting means for detecting a level of an internal voltage; an oscillator for generating a driving pulse signal in response to an output signal of the detecting means; a first driving unit for outputting a first pulse signal after receiving the driving pulse signal; a second driving unit for outputting a second pulse signal after receiving the driving pulse signal; and a pumping unit for changing a potential level of the internal voltage after selectively receiving one of the first pulse signal and the second pulse signal.

In order to achieve the above objects, according to another aspect of the present invention, there is provided an internal voltage generator for a semiconductor device, the internal voltage generator comprising: a first detecting unit and a second detecting unit for detecting a level of an internal voltage; an oscillator for generating a driving pulse signal in response to an output signal of the second detecting unit; a first driving unit for outputting a first pulse signal after receiving the driving pulse signal; a second driving unit for outputting a second pulse signal after receiving the driving pulse signal; and a pumping unit for changing a potential level of the internal voltage after selectively receiving one of the first pulse signal and the second pulse signal, wherein one of the first pulse signal and the second pulse signal is activated by an output signal of the first detecting unit.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
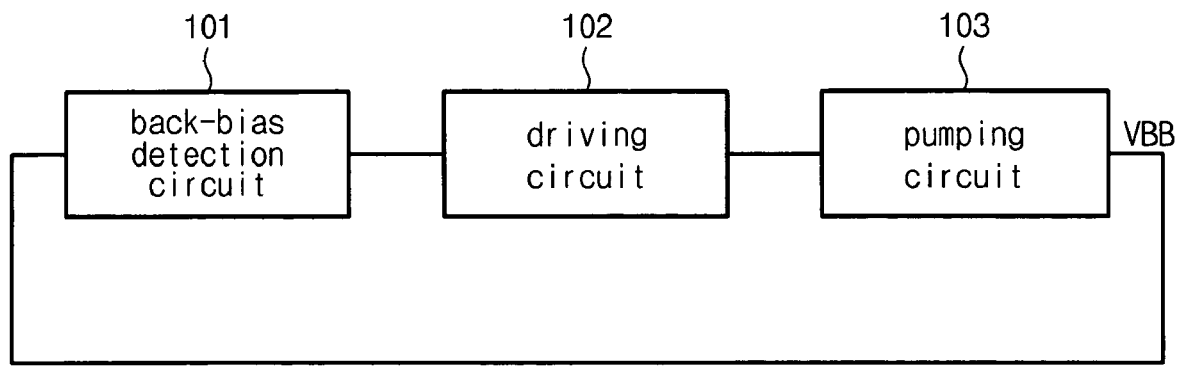
FIG. 1 is a block diagram of a general internal voltage generator for a semiconductor device.
Figure 2:
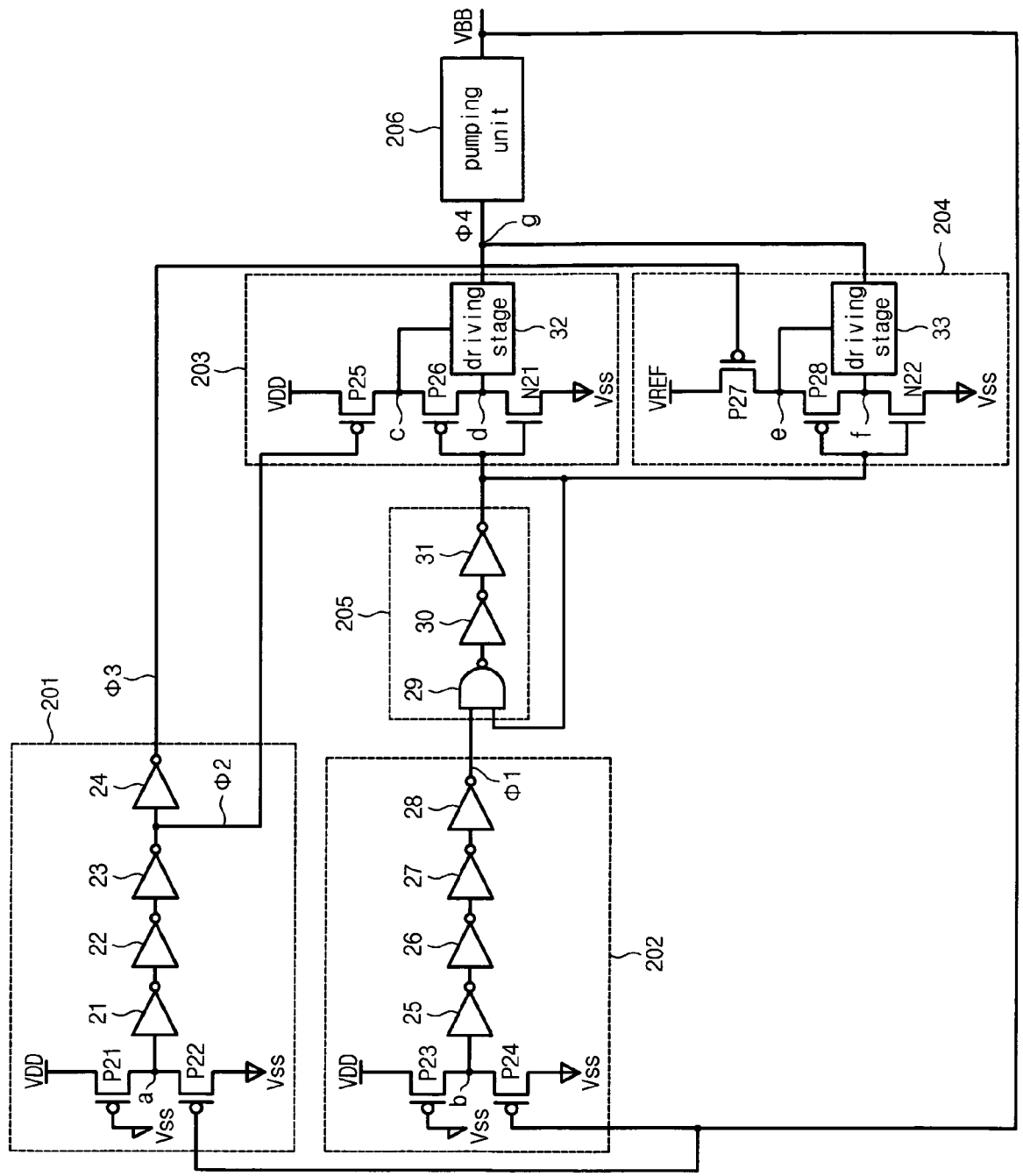
FIG. 2 is a circuit diagram showing an internal voltage generator for a semiconductor device according to one embodiment of the present invention.

FIG. 2 is a circuit diagram showing an internal voltage generator for outputting a back-bias voltage according to one embodiment of the present invention.

As shown in FIG. 2, the internal voltage generator includes detectors 201 and 202 for detecting a potential level of a back-bias voltage VBB (internal voltage), an oscillator 205 for generating a pulse signal of a predetermined period in response to the output signal of the detector 202, driving units 203 and 204 for receiving the output signal of the oscillator 205 and are controlled by the output signal of the detector 201, and a back-bias pumping unit 206 for outputting the back-bias voltage VBB (internal voltage) in response to the output signals of the driving units 203 and 204.

The detector 201 includes a PMOS transistor P21 connected between a supply voltage and a node a, a PMOS transistor P22 connected between the node a and a ground, an inverter 21 for receiving the potential level of the node a, an inverter 22 for receiving the output signal of the inverter 21, an inverter 23 for receiving the output signal of the inverter 22, and an inverter 24 for receiving the output signal of the inverter 23. Herein, the output signal of the inverter 23 is expressed by "Φ2" and the output signal of the inverter 24 is expressed by "Φ3".

In the operation of the internal voltage generator, when the back-bias voltage VBB generated in the pumping unit 206 comes into a VSS level, that is, a chip is initialized, only the PMOS transistor P21 is turned on. Therefore, the output signal "Φ3" is at a high level.

When the back-bias voltage VBB is gradually lowered by a pumping operation, the PMOS transistor P22 is turned on at a predetermined time point. In the state in which the PMOS transistor P22 is turned on, electric current flowing in the PMOS transistor P22 gradually increases according to the continuous reduction of the back-bias voltage. Therefore, the potential level of the node a is gradually lowered. When the potential level of the node a is continuously lowered and then reaches a predetermined level, the output of the inverter 21 shifts to a high level from a low level. In the present embodiment, a back-bias voltage required for allowing the output of the inverter 21 to shift to the high level from the low level is called a detection voltage. In the present embodiment, when the back-bias voltage is about −0.7V, the output of the inverter 21 shifts to the high level from the low level.

The detector 202 includes a PMOS transistor P23 connected between the supply voltage and a node b, a PMOS transistor P24 connected between the node b and the ground, an inverter 25 for receiving the potential level of the node b, an inverter 26 for receiving the output signal of the inverter 25, an inverter 27 for receiving the output signal of the inverter 26, and an inverter 28 for receiving the output signal of the inverter 27. Herein, the output signal of the inverter 28 is expressed by "Φ1".

Basically, the detector 202 has an operation similar to that of the detector 201. However, the detection voltage of the detector 202 is about −0.8V. Accordingly, when the back-bias voltage is about −0.8V, the output of the inverter 25 shifts to a high level from a high level.

The oscillator 205 includes an NAND gate 29, an inverter 30 for receiving the output signal of the NAND gate 29, and an inverter 31 for receiving the output signal of the inverter 30. The NAND gate 29 receives the output signal "Φ1" of the detector 202 and the output signal of the inverter 31.

The oscillator 205 employed in the present embodiment is a circuit element for outputting a pulse of a predetermined period. Therefore, it is apparent to those who skilled in the art that various oscillators having various constructions with the same function as that in the present embodiment can be employed within the scope of the present invention.

The driving unit 203 includes a PMOS transistor P25 connected between the supply voltage VDD and a node c, a PMOS transistor P26 connected between the node c and a node d, an NMOS transistor N21 connected between the node d and the ground, and a driving stage 32 connected between the node d and a node g.

The output signal "Φ2" of the detector 201 is applied to the gate of the PMOS transistor P25. The gate of the PMOS transistor P26 and the gate of the NMOS transistor N21 are connected to each other and receive the output signal of the inverter 31. The driving stage 32 may use a CMOS type inverter, etc. Further, when the PMOS transistor P25 is turned on and the supply voltage VDD is transferred to the node c, the driving stage 32 operates. The output signal "Φ4" of the enabled driving stage 32 is a pulse signal.

The driving unit 204 includes a PMOS transistor P27 connected between a reference voltage VREF and a node e, a PMOS transistor P28 connected between the node e and a node f, an NMOS transistor N22 connected between the node f and the ground, and a driving stage 33 connected between the node f and the node g. Herein, the reference voltage VREF has a potential level lower than the supply voltage VDD.

The output signal "Φ3" of the detector 201 is applied to the gate of the PMOS transistor P27. The gate of the PMOS transistor P27 and the gate of the NMOS transistor N22 are connected to each other and receive the output signal of the inverter 31. The driving stage 33 may use a CMOS type inverter, etc. Further, when the PMOS transistor P27 is turned on and the reference voltage VREF is transferred to the node e, the driving stage 33 is activated. The output signal "Φ4" of the enabled driving stage 33 is a pulse signal. The reference voltage VREF used as the supply voltage of the driving stage 33 is lower than the supply voltage VDD used in the driving unit 203. Therefore, the pulse signal outputted from the driving stage 33 has amplitude smaller than that of the pulse signal outputted from the driving stage 32. Accordingly, the pumping ability of the pumping unit 206 can be controlled by selecting the pulse signals having different amplitudes.

The pumping unit 206 is a circuit element for generating an internal voltage (i.e., back-bias voltage) used in a semiconductor device by a pumping operation after receiving the pulse signal "Φ4". Various embodiments of a pumping unit having the function as described above have been widely known to those skilled in the art, the detailed description for the circuit will be omitted.

Hereinafter, the operation of the embodiment of the present invention shown in FIG. 2 will be described in detail.

The operation before the supply voltage VDD is applied and the operation after the supply voltage VDD has been applied will be described.

First, when the supply voltage VDD is not applied, the internal voltage generator does not operate. In such a case, the back-bias voltage VBB, which is the output voltage of the internal voltage generator, is at a ground level.

Next, a case in which the supply voltage VDD is applied will be described.

When the supply voltage VDD is applied, the transistors P21 and P23 are turned on. Accordingly, the output signal "Φ2" of the inverter 23 is at a low level, the output signal "Φ3" of the inverter 24 is at a high level and the output signal "Φ1" of the inverter 28 is at a high level.

Since the output signal "Φ2" of the inverter 23 is at the low level, the transistor P25 is turned on and the transistor P27 is turned off. Accordingly, the driving unit 203 is in an activated state and the driving unit 204 maintains a deactivated state.

Further, since the output signal "Φ1" of the inverter 28 is at the high level, the inverter 31 of the oscillator 205 outputs a pulse signal of a predetermined period. The pulse signal outputted from the inverter 31 is applied to the driving unit 203. Since the driving unit 203 is in an enabled state, the pulse signal is transferred to the node d. Herein, since the driving stage 32 is also in an enabled state, the pulse signal "Φ4" is outputted through the output node g of the driving stage 32. The pulse signal "Φ4" outputted from the driving stage 32 has a high level VDD and a low level VSS. That is, the pulse signal "Φ4" has an amplitude of VDD.

The pulse signal "Φ4" outputted from the driving stage 32 is applied to the pumping unit 206. The pumping unit 206 receiving the pulse signal "Φ4" performs a pumping operation and lowers the back-bias voltage VBB.

When the back-bias voltage VBB is gradually lowered by the pumping operation, the transistor P22 is turned on at a predetermined time point. As described above, in a state in which the transistor P22 is turned on, the electric current flowing in the PMOS transistor .P22 gradually increases according to the continuous reduction of the back-bias voltage. Accordingly, the potential level at the node a is gradually lowered. When the potential level at the node a is continuously lowered and then reaches the predetermined level, the output of the inverter 21 shifts to the high level from the low level. In the present embodiment as described above, when the back-bias voltage is about −0.7V, the output of the inverter 21 shifts to the high level from the low level.

Hereinafter, a case in which the back-bias voltage is smaller than −0.7V will be described in detail.

When the back-bias voltage is smaller than −0.7V, the output signal "Φ2" of the inverter 23 is at a high level and the output signal "Φ3" of the inverter 24 is at a low level. Accordingly, the transistor P25 of the driving unit 203 is turned off and the transistor P27 of the driving unit 204 is turned on. Consequently, the operation of the driving unit 203 is disabled and the operation of the driving unit 204 is enabled.

When the back-bias voltage has a value between −0.7V~−0.8V, the output signal "Φ1" of the detector 202 still remains at a high level. Accordingly, the oscillator 205 outputs the pulse signal of the predetermined period. The pulse signal of the oscillator 205 is transferred to the node f of the driving unit 204. The pulse signal of the node f is applied to the pumping unit 206 through the driving stage 33. Herein, since the driving stage 33 operates by the reference voltage VREF having a potential level smaller than the supply voltage VDD, the pulse signal outputted from the driving stage 33 has amplitude of VREF. Accordingly, as compared with a case in which the pumping unit 206 is operated by the driving stage 32, when the pumping unit 206 is operated by the driving stage 33, charge-pumping ability is reduced. Therefore, the down speed of the back-bias voltage is relatively lowered.

Then, when the back-bias voltage reaches about −0.8V by the continuous pumping operation, the transistor P24 is sufficiently turned on, so that the output signal of the transistor P25 comes into a high level. In such a case, the output signal "Φ1" of the detector 202 comes into a low level. Consequently, the output signal of the inverter 31 maintains a high level.

Since the output signal of the inverter 31 is at the high level, the node f of the driving unit 204 is at a low level. Therefore, the output signal of the driving stage 33 is at a low level. Consequently, the pumping operation of the pumping unit 206 is disabled, so that the back-bias voltage of the pumping unit 206 maintains −0.8V.

If the back-bias voltage VBB exceeds −0.8V, for example, the back-bias voltage VBB is −0.74V, the feedback operation as described above is repeated. Therefore, a constant back-bias voltage, that is, −0.8V, is maintained.

According to the present invention as described above, the back-bias voltage generator accelerates the down speed of a back-bias voltage initially and then slows the down speed of the back-bias voltage when the back-bias voltage reaches around a target level, thereby providing a stable back-bias voltage.

That is, the back-bias voltage generator applies a pulse signal having a high pulse amplitude VDD to the pumping unit 206 before the back-bias voltage reaches a first detection voltage −0.7V, thereby accelerating the down speed of the back-bias voltage.

Then, when the back-bias voltage reaches the first detection voltage −0.7V, the back-bias voltage generator applies a pulse signal having a low pulse amplitude VREF to the pumping unit 206, thereby slowing the down speed of the back-bias voltage.

Then, when the back-bias voltage reaches a second detection voltage −0.8V, the back-bias voltage generator disables the operation of the pumping unit 206, thereby allowing the back-bias voltage of −0.8V to be maintained.

The embodiment of the present invention relates to a back-bias voltage generator. However, the technical idea of the present invention can also be applied to a high voltage generator for generating a voltage higher than a supply voltage.

A stable internal voltage can be generated within a short time by employing an internal voltage generator of the present invention as described above.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. An internal voltage generator for a semiconductor device, the internal voltage generator comprising:
    a detector circuit that detects a level of an internal voltage;
    an oscillator generating a driving pulse signal in response to an output signal of the detector circuit;
    a first driving unit for outputting a first output pulse signal having a first amplitude, after receiving the driving pulse signal from the oscillator;
    a second driving unit for outputting a second output pulse signal having a second amplitude different than the first amplitude, after receiving the driving pulse signal from the oscillator; and
    a pumping unit for changing a potential level of the internal voltage after selectively receiving one of the first output pulse signal and the second output pulse signal.

2. The internal voltage generator as claimed in claim 1, wherein the first output pulse signal has the first amplitude larger than the second amplitude of the second output pulse signal.

3. The internal voltage generator as claimed in claim 2, wherein the pumping unit is operated by the first output pulse signal before the internal voltage reaches a first voltage level, and the pumping unit is operated by the second output pulse signal until the internal voltage reaches a target level after exceeding the first voltage level.

4. The internal voltage generator as claimed in claim 2, wherein the detector circuit comprises a first detecting unit and a second detecting unit, the oscillator is controlled by an output signal of the second detecting unit, and one of the first detecting unit and the second detecting unit is selectively enabled by an output signal of the first detecting unit.

5. The internal voltage generator as claimed in claim 4, wherein the pumping unit is operated by the first output pulse signal before the internal voltage reaches a first voltage level, and the pumping unit is operated by the second output pulse signal until the internal voltage reaches a target level after exceeding the first voltage level.

6. An internal voltage generator for a semiconductor device, the internal voltage generator comprising:
    a first detecting unit and a second detecting unit for detecting a level of an internal voltage;
    an oscillator for generating a first driving pulse signal in response to an output signal from the second detecting unit;

a first driving unit that outputs a first output pulse signal, having a first amplitude, after receiving the first driving pulse signal;
a second driving unit that outputs a second output pulse signal, having a second amplitude different that the rest amplitude, after receiving the first driving pulse signal; and
a pumping unit for changing a potential level of the internal voltage after selectively receiving one of the first output pulse signal and the second output pulse signal,
wherein one of the first output pulse signal and the second output pulse signal is activated by an output signal of the first detecting unit.

7. The internal voltage generator as claimed in claim 6, wherein the first output pulse signal is applied to the pumping unit before the internal voltage of the pumping unit reaches a first voltage level, and the second output pulse signal is applied to the pumping unit until the internal voltage reaches a second voltage level after exceeding the first voltage level.

8. The internal voltage generator as claimed in claim 6, wherein the first output pulse signal has the first amplitude larger than the second amplitude of the second output pulse signal.

* * * * *